United States Patent [19]

Ogata

[11] Patent Number: 5,271,147
[45] Date of Patent: Dec. 21, 1993

[54] OUTER BONDING TOOL FOR TAPE CARRIER AND METHOD OF PRODUCING SEMICONDUCTOR DEVICE

[75] Inventor: Kinuko Ogata, Kawasaki, Japan

[73] Assignee: Fujitsu Limited, Japan

[21] Appl. No.: 895,800

[22] Filed: Jun. 9, 1992

[30] Foreign Application Priority Data

Jun. 10, 1991 [JP] Japan .................... 3-137320

[51] Int. Cl.⁵ .................... H01R 43/00; B23K 1/02
[52] U.S. Cl. .................... 29/827; 219/85.16; 219/85.18
[58] Field of Search .............. 219/85.16, 85.18; 228/180.2; 29/827

[56] References Cited

U.S. PATENT DOCUMENTS

| | | | |
|---|---|---|---|
| 4,855,559 | 8/1989 | Donner | 228/180.2 X |
| 4,894,506 | 1/1990 | Woerner | 219/85.18 X |
| 5,066,844 | 11/1991 | Schuster et al. | 219/85.16 |
| 5,080,279 | 1/1992 | Davison | 228/180.2 X |
| 5,098,008 | 3/1992 | Viza et al. | 228/180.2 |
| 5,142,450 | 8/1992 | Olson et al. | 29/827 |

OTHER PUBLICATIONS

IBM Technical Disel Bull vol 18 No 12 May 1976 p. 3984, by E. C. Baldwin et al.
IBM Technical Disel Bull vol 22 No 1 Jun. 1979 pp. 69-70 by Houser.

*Primary Examiner*—Carl J. Arbes
*Attorney, Agent, or Firm*—Welsh & Katz, Ltd.

[57] ABSTRACT

An outer bonding tool is used for bonding outer leads of a tape carrier on corresponding pads which are formed on a circuit substrate by solder after bonding inner leads of the tape carrier and electrodes of a generally rectangular semiconductor chip. The outer bonding tool includes a main body having a bottom surface, a pressing surface provided at the bottom surface of the main body for pressing against the outer leads of the tape carrier, where the pressing surface has a generally rectangular frame shape, and a groove formed in the pressing surface and extending generally perpendicularly to a corresponding group of outer leads extending from one side of the semiconductor chip. A width of the groove taken in a direction in which the corresponding group of outer leads extend is smaller than a length of the outer leads.

21 Claims, 8 Drawing Sheets

OUTER BONDING TOOL FOR TAPE CARRIER AND METHOD OF PRODUCING SEMICONDUCTOR DEVICE

BACKGROUND OF THE INVENTION

The present invention generally relates to outer bonding tools and methods of producing semiconductor devices using the outer bonding tool, and more particularly to an outer bonding tool for a tape carrier and a method of producing semiconductor devices using such an outer bonding tool.

The number of pins of integrated circuits (ICs) and large scale integrated circuits (LSIs) in particular has increased. Hence, when packaging a semiconductor chip on the surface of a circuit substrate, electrodes of the semiconductor chip are bonded to inner leads of leads which are arranged on a tape carrier, so as to assemble the semiconductor chip to the tape carrier. On the other hand, outer leads of the tape carrier are connected to patterns of the circuit substrate. This method of packaging the semiconductor chip can easily be automated and is popularly used for this reason.

FIG. 1 shows an example of the semiconductor chip which is packaged on the surface of the circuit substrate by the above described method.

In FIG. 1, a tape carrier 3 is made of a band-shaped resin film such as a polyimide system resin tape, and rectangular device holes 31 are arranged in line in the tape carrier 3 so that semiconductor chips 2 can successively be packaged thereon. Each device hole 31 has a size slightly larger than the side of the semiconductor chip 2 in the plan view. The packaging process can roughly be divided into a tape process and a semiconductor assembling process.

In the tape process, a resin film applied with an adhesive agent is cut into a band shape, and a copper film having a thickness of 20 to 40 $\mu$m is laminated on the surface of the resin film. Then, the copper film is etched to form leads 35 at each part where the device hole 31 will be formed, so that the leads 35 would extend perpendicularly to each side of the rectangular device hole 31 when the device hole 31 is formed.

Each lead 35 is made up of a linear inner lead 35A which is parallel to the X-axis (or Y-axis), a central part which extends radially, and a linear outer lead 35B which is parallel to the X-axis (or Y-axis). A tip end of the inner lead 35A is arranged at a position corresponding to an electrode of the semiconductor chip 2.

Thereafter, the resin film is etched to form the rectangular device holes 31 and support films 32. Each device hole 31 is formed so that the inner leads 35A are arranged perpendicularly to each side of the device hole 31. Each support film 32 is formed to surround the corresponding device hole 31.

Next, in the semiconductor assembling process, the semiconductor chip 2 is inserted into the device hole 31 from under the device hole 31, and the electrodes of the semiconductor chip 2 are bonded to the corresponding inner leads 35A by a thermocompression bonding using an inner bonding tool.

Thereafter, the end parts of the outer leads 35B are cut at positions adjacent to the respective sides of an outer hole, and the leads 35 are subjected to a forming process so that the outer leads 35B are formed to an approximate Z-shape.

On the other hand, a rectangular packaging region having a size approximately the same as that of the tape carrier 3 in the plan view is imaged on the packaging surface of a circuit substrate 1 on which the tape carrier 3 is packaged by an outer lead bonding. Patterns 11 are arranged perpendicularly to each side of the rectangular packaging region of the circuit substrate 1. Elongated pads 12 are provided at terminals of the patterns 11 to be bonded to the outer leads 35B when making the outer lead bonding.

Then, the outer leads 35B are aligned to the corresponding pads 12, and the tape carrier 3 mounted with the semiconductor chip 2 is placed on the circuit substrate 1. An outer bonding tool (not shown) which is heated to 250° to 300° C. is used to push the outer leads 35B against the corresponding pads 12, and the outer leads 35B and the corresponding pads 12 are bonded by a thermocompression bonding.

FIGS. 2A through 2C respectively show cross sections of parts at essential stages of the conventional semiconductor assembling process described above, and FIG. 3 shows an essential part of the tape carrier 3 after the outer lead bonding.

In a cross section shown in FIG. 2A, an outer bonding tool 4 has an internal heater (not shown) and is controlled to a temperature of 250° to 300° C. when in use. This outer bonding tool 4 is made of a metal such as steel materials.

The lower surface of the outer bonding tool 4 has a rectangular shape such that each side is slightly greater than the outer dimension of the tape carrier 3. A depression (or well) is provided at the central part of this lower surface of the outer bonding tool 4. The shape of this depression resembles the outer contour of the support film 32 but is slightly greater than the outer contour of the support film 32. In addition, the depth of this depression is greater than the height of the semiconductor chip 2. Hence, a pressing surface 41 at the lower surface of the outer bonding tool 4 has a frame shape to push the top surfaces of the outer leads 35B.

On the other hand, the pads 12 arranged in the frame shape on the surface of the circuit substrate 1 has a width B1 shown in FIG. 2B and a length L shown in FIG. 2C. FIG. 2B is a front view in cross section and FIG. 2C is a side view in cross section. The pads 12 are arranged with a pitch P shown in FIG. 2B. For example, the width $B_1$ is 100 $\mu$m, the length L is 1500 $\mu$m, and the pitch P is 150 to 200 $\mu$m.

The outer lead 35B of the tape carrier 3 has a width $B_2$ shown in FIG. 2B which is slightly smaller than the width $B_1$ of the pad 12. The length of a part of the outer lead 35B which is bonded is shorter than the length L of the pad 12 (for example, 1200 $\mu$m shorter). For example, the width $B_2$ is 80 $\mu$m.

In order to improve the bonding characteristic when bonding the outer lead 35B and the corresponding pad 12, a solder paste 15 is precoated on the surface of the pad 12 as shown in FIG. 2B. The solder paste 15 desirably has a film thickness H of 40 $\mu$m.

When bonding the outer leads 35B of the tape carrier 3, the outer leads 35B are first aligned to the corresponding pads 12, and the tape carrier 3 mounted with the semiconductor chip 2 is placed on the circuit substrate 1. Next, the outer bonding tool 4 which is heated to a temperature of 250° to 300° C. is lowered onto the tape carrier 3, so that the pressing surface 41 makes contact with the top surfaces of the outer leads 35B. The outer bonding tool 4 is further lowered when the solder paste 15 reflows, so as to push against the outer leads 35B with a force of 20 to 30 g per lead. The temperature of the outer bonding tool 4 is lowered in this state so that the solder paste 15 hardens. As a result, the outer leads 35B and the corresponding pads 12 are bonded by the hardened solder paste 15.

But as shown in FIGS.2B and 2C, the solder paste 15 which is precoated on the surfaces of the pads 12 does not have a flat top surface and forms a bump. In addition, the film thickness H of the solder paste 15 is inconsistent among the pads 12 and varies from 20 to 60 $\mu$m although originally intended to be 40 $\mu$m.

For this reason, when the outer bonding tool 4 is lowered onto the solder paste 15 and heats the same, there is a problem in that the solder paste 15 having a large film thickness H flows horizontally beyond the corresponding pad 12 as shown in FIG.3 and a solder bridge 15P is formed between two adjacent pads 12. This solder bridge 15P will short-circuit the outer leads 35B and the semiconductor chip 2 will not operate in a normal manner. FIG.3 is a front view in cross section.

On the other hand, when the solder paste 15 is melted by the outer bonding tool 4, the melted solder tends to flow downwardly due to gravity, and in this case, flows horizontally on the surface of the circuit substrate 1. For this reason, the solder paste 15 mainly connects the top surface of the pad 12 and the bottom surface of the corresponding outer lead 35B, and the solder paste 15 does not flow around the outer lead 35B onto the top surface of the outer lead 35B. As a result, the bonding between the outer lead 35B and the pad 12 is essentially achieved solely by the solder paste 15 between the bottom surface of the outer lead 35B and the top surface of the pad 12, and the outer lead 35B may easily disengage from the corresponding pad 12 due to the insufficient bonding provided by the solder paste 15.

Conventionally, the length of the pressing surface 41 is approximately the same or greater than the length of the outer lead 35B as shown in FIG.2C in order to uniformly heat the outer lead 35B and uniformly melt the solder paste 15. Consequently, the pressing surface 41 also prevents the flow of the melted solder paste 15 from reaching the top surface of the outer lead 35B, thereby causing the above insufficient bonding.

SUMMARY OF THE INVENTION

Accordingly, it is a general object of the present invention to provide a novel and useful outer bonding tool for a tape carrier and a method of producing semiconductor devices using such an outer bonding tool, in which the problems described above are eliminated.

Another and more specific object of the present invention is to provide an outer bonding tool adapted for use in bonding outer leads of a tape carrier on corresponding pads which are formed on a circuit substrate by solder after bonding inner leads of the tape carrier and electrodes of a generally rectangular semiconductor chip, including a main body having a bottom surface, a pressing surface provided at the bottom surface of the main body for pressing against the outer leads of the tape carrier, where the pressing surface has a generally rectangular frame shape, and a groove formed in the pressing surface and extending generally perpendicularly to a corresponding group of outer leads which extends outwards in a predetermined direction from one side of the semiconductor chip, where predetermined width of the groove taken in a direction is smaller than a length of the outer leads. According to the outer bonding tool of the present invention, it is possible to prevent mutually adjacent outer leads from becoming short-circuited and also provide an improved bonding between the outer leads and the corresponding pads.

Still another object of the present invention is to provide an outer bonding tool adapted for use in bonding outer leads of a tape carrier on corresponding pads which are formed on a circuit substrate by solder after bonding inner leads of the tape carrier and electrodes of a generally rectangular semiconductor chip, including an inner tool part having a bottom surface, a first pressing surface provided at the bottom surface of the inner tool part for pressing against the outer leads of the tape carrier, where the first pressing surface has a generally rectangular frame shape, an outer tool part having a bottom surface, where the outer tool part is arranged on an outer side of the inner tool part, a second pressing surface provided at the bottom surface of the outer tool part for pressing against the outer leads of the tape carrier, where the second pressing surface has a generally rectangular frame shape, a gap is formed between the first and second pressing surfaces and extending generally perpendicularly to each corresponding group of outer leads extending from four sides of the semiconductor chip and a width of the gap taken in a direction in which the corresponding group of outer leads extend is smaller than a length of the outer leads. According to the outer bonding tool of the present invention, it is possible to prevent mutually adjacent outer leads from becoming short-circuited and also provide an improved bonding between the outer leads and the corresponding pads.

A further object of the present invention is to provide a method of producing a semiconductor device using an outer bonding tool which is adapted for use in bonding outer leads of a tape carrier on corresponding pads which are formed on a circuit substrate by solder after bonding inner leads of the tape carrier and electrodes of a generally rectangular semiconductor chip, where the outer bonding tool includes a main body having a bottom surface, a pressing surface provided at the bottom surface of the main body for pressing against the outer leads of the tape carrier, the pressing surface having a generally rectangular frame shape, and a groove formed in the pressing surface and extending generally perpendicularly to a corresponding group of outer leads extending from one side of the semiconductor chip, a width of the groove taken in a direction in which the corresponding group of outer leads extend being smaller than a length of the outer leads, and the method comprises the steps of (a) aligning the outer leads on the corresponding pads which are precoated with solder so that a bottom surface of each outer lead rests on the solder precoated on the corresponding pad on the circuit substrate, and (b) moving the main body of the outer bonding tool relative to the circuit substrate so that the pressing surface presses against each top surface of the outer leads, where the pressing surface is heated to a predetermined temperature for a predetermined time to melt the solder at least while the pressing surface makes contact with the outer leads, so that the melted solder flows around sides of the outer lead and reaches the top surface of the outer lead via the groove. According to the method of the present invention, it is possible to prevent mutually adjacent outer leads from becoming short-circuited and also provide an improved bonding between the outer leads and the corresponding pads.

Another object of the present invention is to provide a method of producing a semiconductor device using an outer bonding tool which is adapted for use in bonding outer leads of a tape carrier on corresponding pads which are formed on a circuit substrate by solder after bonding inner leads of the tape carrier and electrodes of a generally rectangular semiconductor chip, where the outer bonding tool includes an inner tool part having a bottom surface, a first pressing surface provided at the bottom surface of the inner tool part for pressing against the outer leads of the tape carrier, the first pressing surface having a generally rectangular frame shape, an outer tool part having a bottom surface, the outer tool part being arranged on an outer side of the inner tool part, a second pressing surface provided at the bottom surface of the outer tool part for pressing against the outer leads of the tape carrier, the second pressing surface having a generally rectangular frame shape, a gap being formed between the first and second pressing surfaces and extending generally perpendicularly to each corresponding group of outer leads extending from four sides of the semiconductor chip, a width of the gap taken in a direction in which the corresponding group of outer leads extend being smaller than a length of the outer leads, and the method comprises the steps of (a) aligning the outer leads on the corresponding pads which are precoated with solder so that a bottom surface of each outer lead rests on the solder precoated on the corresponding pad on the circuit substrate, (b) moving the inner tool part relative to the circuit substrate so that the first pressing surface presses against each top surface of the outer leads, the first pressing surface being heated to a predetermined temperature for a first predetermined time to melt the solder at least while the first pressing surface makes contact with the outer leads, and (c) moving the outer tool part relative to the circuit substrate so that the second pressing surface presses against each top surface of the outer leads, the second pressing surface being heated to a predetermined temperature for a second predetermined time to melt the solder at least while the second pressing surface makes contact with the outer leads, where a gap formed between the inner and outer tool parts permits the melted solder to flow around sides of the outer lead and reach the top surface of the outer lead. According to the method of the present invention, it is possible to prevent mutually adjacent outer leads from becoming short-circuited and also provide an improved bonding between the outer leads and the corresponding pads.

Still another object of the present invention is to provide a method of producing a semiconductor device using an outer bonding tool which is adapted for use in bonding outer leads of a tape carrier on corresponding pads which are formed on a circuit substrate by solder after bonding inner leads of the tape carrier and electrodes of a generally rectangular semiconductor chip, which method includes the steps of (a) aligning the outer leads on the corresponding pads which are precoated with solder so that a bottom surface of each outer lead rests on the solder precoated on the corresponding pad on the circuit substrate, and (b) pressing and heating the outer leads by the outer bonding tool which makes contact with top surfaces of the outer leads so that melted solder flows around sides of the outer lead and reaches the top surface of the outer lead. According to the method of the present invention, it is possible to prevent mutually adjacent outer leads from becoming short-circuited and also provide an improved bonding between the outer leads and the corresponding pads.

Other objects and further features of the present invention will be apparent from the following detailed description when read in conjunction with the accompanying drawings.

DESCRIPTION OF THE PREFERRED EMBODIMENTS

First, a description will be given of a first embodiment of a method of producing a semiconductor device according to the present invention, by referring to FIGS.4 through 6. This embodiment of the method uses a first embodiment of an outer bonding tool according to the present invention.

Figure 1:
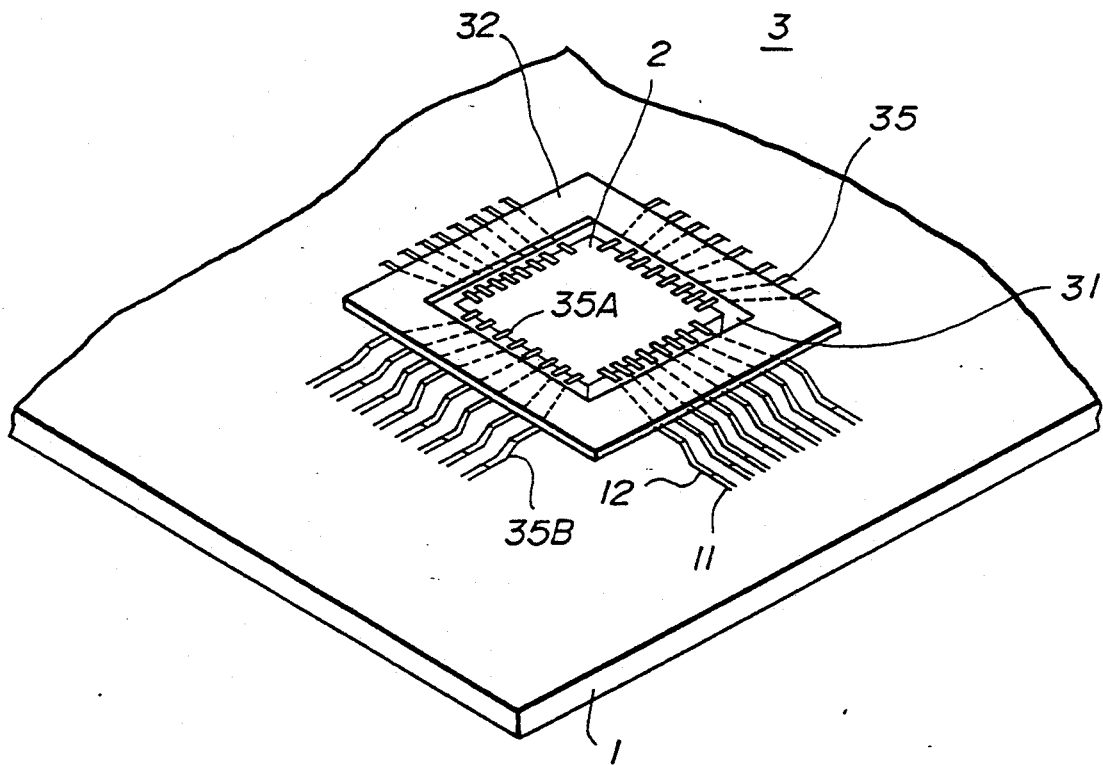
FIG.1 is a perspective view showing an example of a semiconductor chip which is packaged on a surface of a circuit substrate by a conventional method.
Figure 2A:
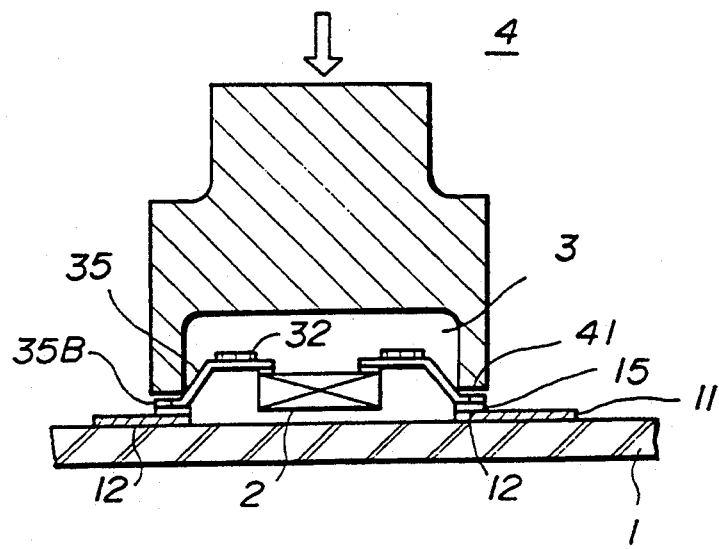
FIGS.2A through 2C are cross sectional views showing parts at essential stages of a conventional semiconductor assembling process.
Figure 2B:
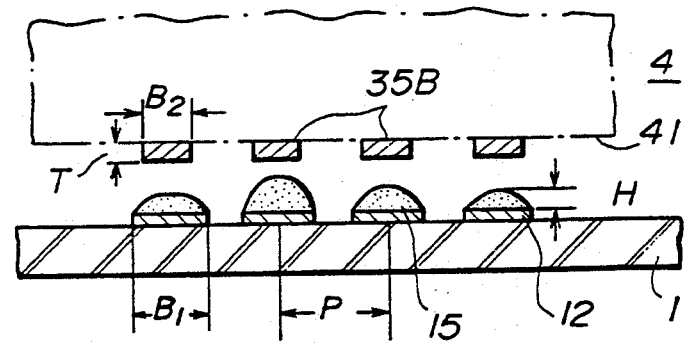
Figure 2C:
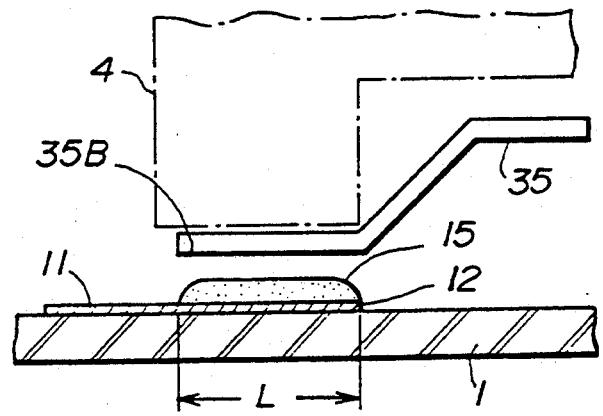
Figure 3:
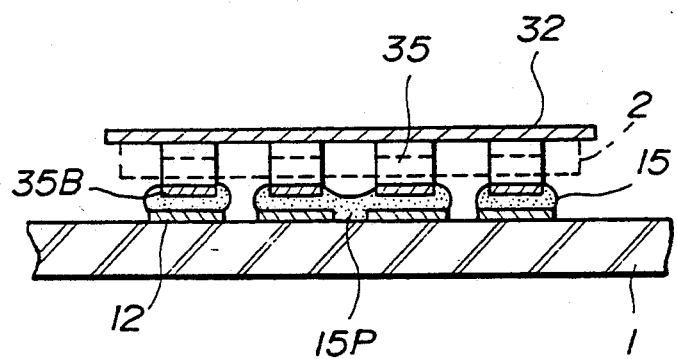
FIG.3 shows an essential part of a tape carrier after an outer lead bonding.
Figure 4:
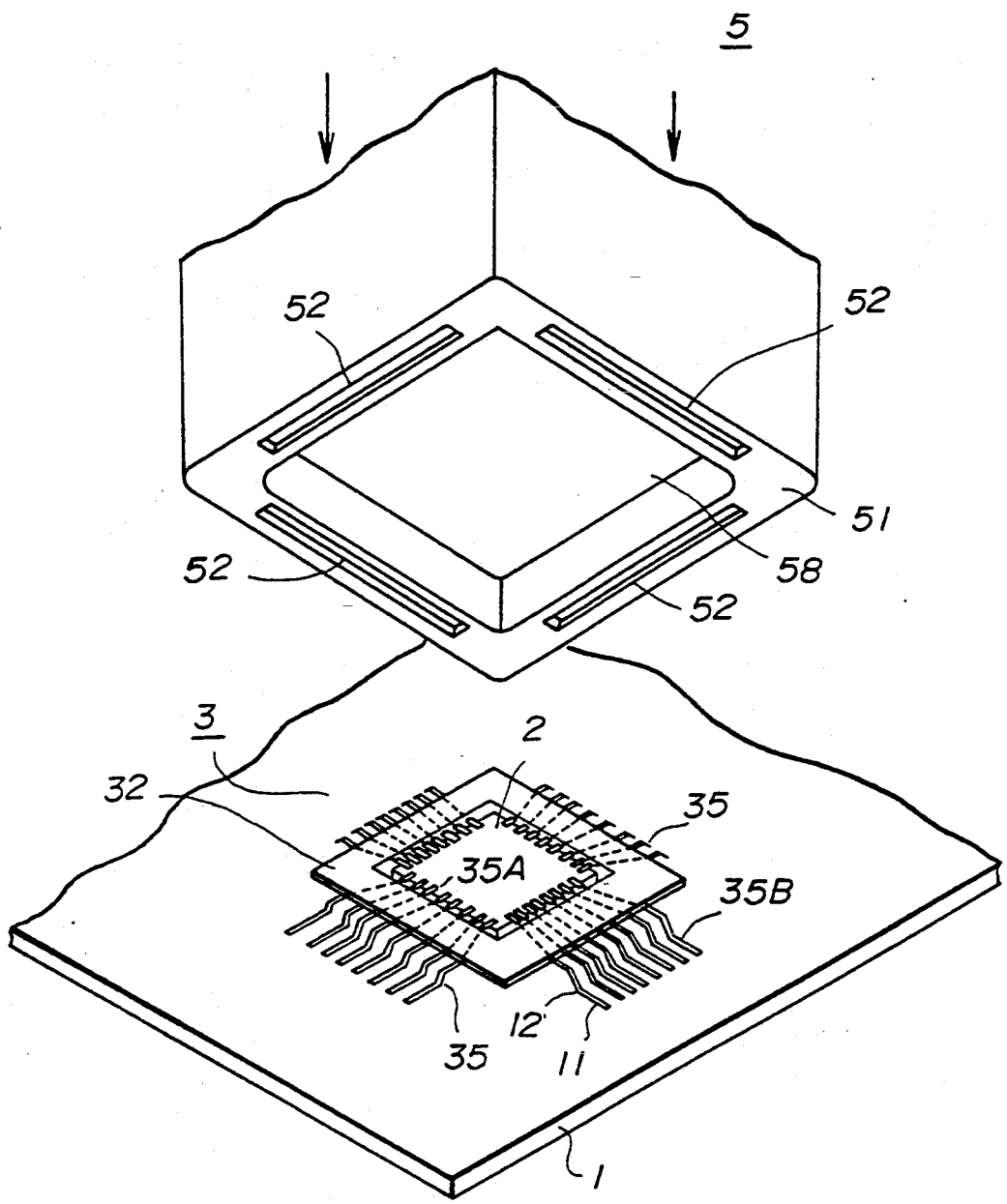
FIG.4 is a perspective view showing a first embodiment of an outer bonding tool according to the present invention together with a tape carrier.
Figure 5A:
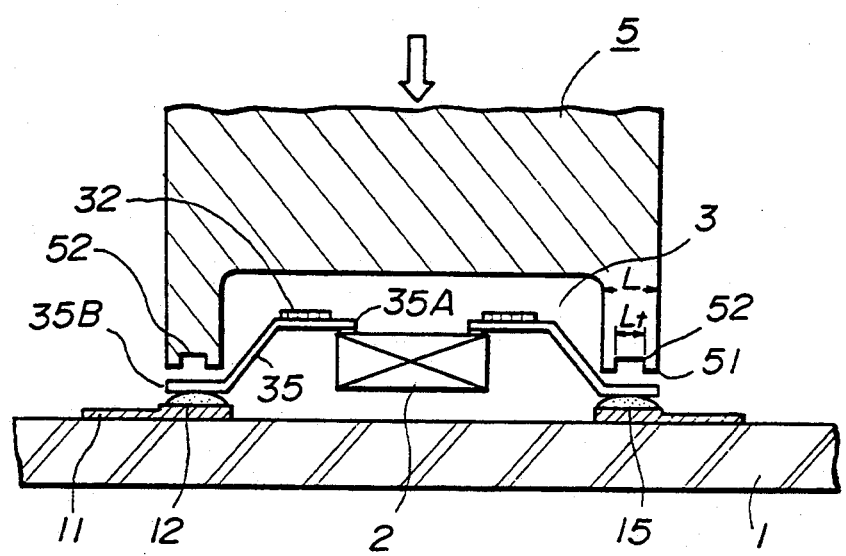
FIGS.5A and 5B are cross sectional views showing parts at essential stages of a first embodiment of a method of producing a semiconductor device according to the present invention.
Figure 5B:
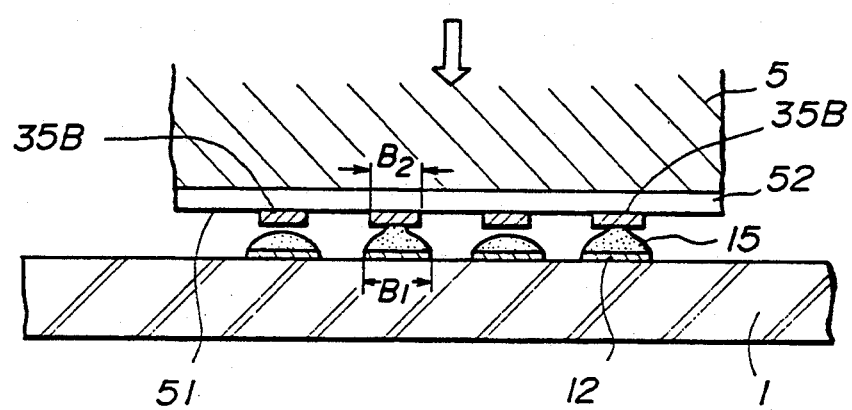
Figure 6A:
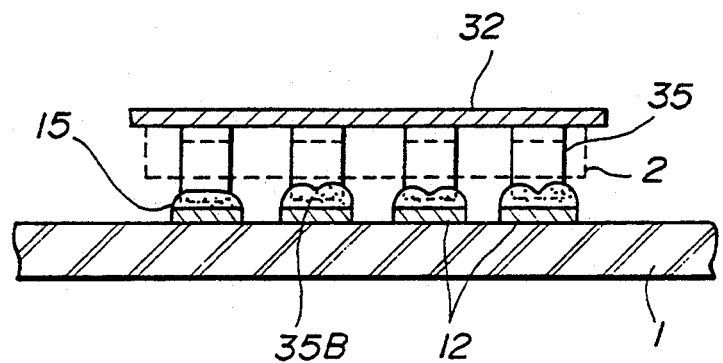
FIGS.6A and 6B are cross sectional views showing essential parts of the tape carrier after an outer lead bonding.
Figure 6B:
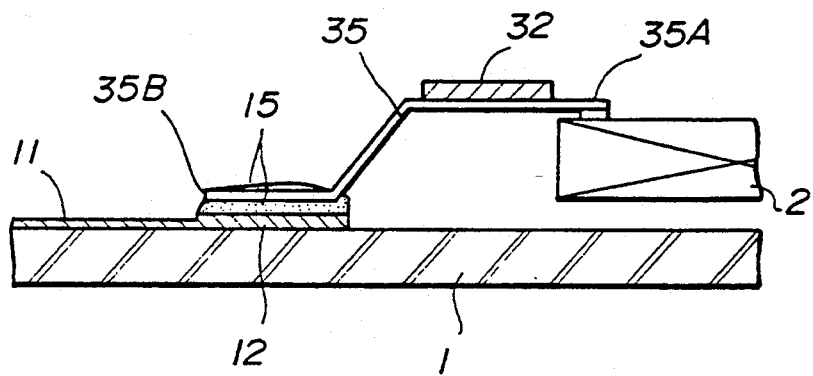

FIG.4 shows the first embodiment of the outer bonding tool together with the tape carrier. FIGS.5A and 5B respectively are a side view and a front view in cross section showing parts at essential stages of the first embodiment of the method. FIGS.6A and 6B respectively are a front view and a side view in cross section showing essential parts of the tape carrier after an outer lead bonding. In FIGS.4 through 6, those parts which are the same as those corresponding parts in FIGS.1 through 3 are designated by the same reference numerals, and a description thereof will be omitted.

In FIGS.4 and 5, the pads 12 are arranged in the form of a frame on the surface of the circuit substrate 1. Each pad 12 has a width of approximately 100 $\mu$m and a length of approximately 1500 $\mu$m, and the pads 12 are arranged with a pitch of 150 to 200 $\mu$m.

Each outer lead 35B of the tape carrier 3 has a thickness of 20 to 40 μm and a width of approximately 80 μm which is smaller than the width of the pad 12. A part of the outer lead 35B to be bonded is approximately 1200 μm and shorter than the length of the pad 12.

As shown in FIG.5B, the solder paste 15 is precoated on the surfaces of the pads 12 so as to improve the bonding characteristic between the outer leads 35B and the corresponding pads 12. Although the solder paste 15 is formed so that the film thickness thereof is approximately 40 μm, the film thickness is inconsistent in actual practice and varies from 20 to 60 μm.

An outer bonding tool 5 shown in FIGS.4 and 5A has a built-in heater (not shown) and is controlled to a temperature of 250° to 300° C. when in use. A lower part, that is, a pushing part of the outer bonding tool 5 is made of a metal such as stainless steel which has a high thermal conductivity and satisfactorily repels the solder.

The lower surface of the outer bonding tool 5 has a rectangular shape shown in FIG.4 such that each side is slightly greater than the outer dimension of the tape carrier 3. A depression (or well) 58 is provided at the central part of this lower surface of the outer bonding tool 5. The shape of this depression 58 resembles the outer contour of the support film 32 but is slightly greater than the outer contour of the support film 32. In addition, the depth of this depression 58 is greater than the height of the semiconductor chip 2. Hence, a pressing surface 51 at the lower surface of the outer bonding tool 5 has a frame shape to push the top surfaces of the outer leads 35B.

In addition, U-shaped grooves 52 are formed along the four sides of the pressing surface 51. A width $L_1$ of each U-shaped groove 52 is slightly smaller than the length of the outer lead 35B. In the case where the outer lead 35B has the length of approximately 1200 μm, the width $L_1$ of the U-shaped groove 52 is 500 to 700 μm, for example. The U-shaped groove 52 has a depth of approximately 100 μm.

When bonding the outer leads 35B of the tape carrier 3 on the corresponding pads 12 using the above described bonding tool 5, the outer leads 35B are first aligned to the corresponding pads 12 and the tape carrier 3 having the semiconductor chip 2 mounted thereon is placed on the circuit substrate 1. Next, the outer bonding tool 5 which is heated to a temperature of 250° to 300° C. is lowered onto the tape carrier 3, so that the pressing surface 51 makes contact with the top surfaces of the outer leads 35B. The outer bonding tool 5 is further lowered when the solder paste 15 reflows, so as to push against the outer leads 35B with a force of 20 to 30 g per lead. The temperature of the outer bonding tool 5 is lowered in this state so that the solder paste 15 hardens. As a result, the outer leads 35B and the corresponding pads 12 are bonded by the hardened solder paste 15.

The solder paste 15 precoated on the surface of the pads 12 has an inconsistent film thickness among the pads 12 and is also has the shape of a bump. However, when the outer bonding tool 5 is used, the top of the solder bump of the solder paste 15 will not be pressed by the pressing surface 51 due to the provision of the U-shaped groove 52. In other words, the pressing force acting on the top of the solder bump is small. For this reason, the solder paste 15 which is melted by the outer bonding tool 5 is suppressed from spreading beyond the pad 12 towards the adjacent pad 12, but instead, flows around both sides of the outer lead 35B and covers the top surface of the outer lead 35B.

Therefore, according to this embodiment, it is possible to prevent the short-circuiting of two mutually adjacent outer leads 35B because the melted solder paste 15 is prevented from flowing horizontally towards the adjacent pad 12, as may be seen from FIG.6A. In addition, it is also possible to realize a satisfactory bonding between each corresponding outer lead 35B and pad 12 because the melted solder paste 15 covers the top and side surfaces of the outer lead 35B, as may be seen from FIG.6B.

Although the contact area of the pressing surface 51 with respect to the outer lead 35B is not as large as in the conventional case, the contact area is sufficiently large to ensure uniform heating of the outer lead 35B and uniform melting of the solder paste 15. This similarly applies to the other embodiments which will be described later.

Next, a description will be given of a second embodiment of the method of producing the semiconductor device according to the present invention, by referring to FIGS.7 and 8. This embodiment of the method uses a second embodiment of the outer bonding tool according to the present invention.

Figure 7:
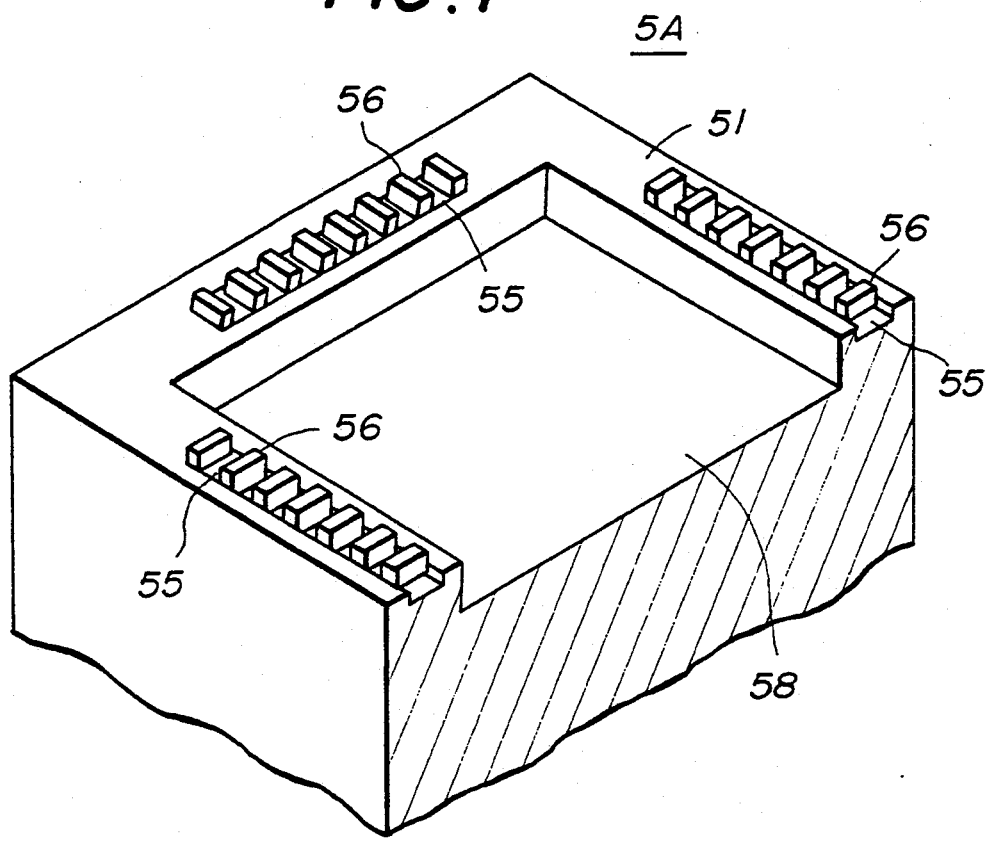
FIG.7 is a perspective view showing an essential bottom part of a second embodiment of the outer bonding tool according to the present invention.
Figure 8:
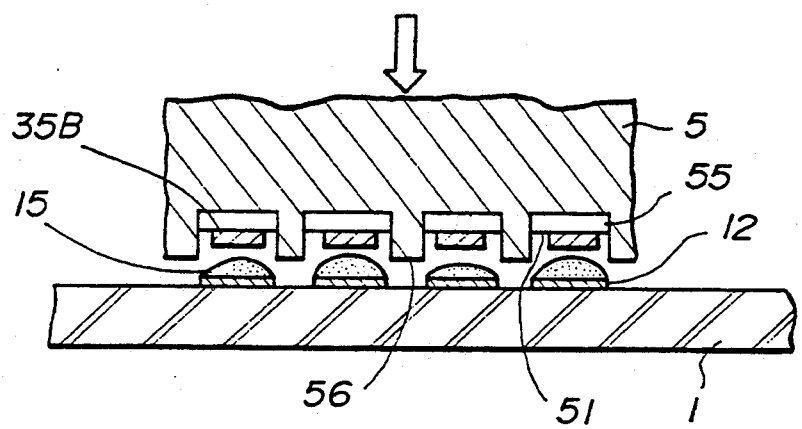
FIG.8 is a cross sectional view showing parts at an essential stage of a second embodiment of the method of producing the semiconductor device according to the present invention.

FIG.7 shows an essential bottom part of the second embodiment of the outer bonding tool. FIG.8 is a front view in cross section showing parts at essential stages of the second embodiment of the method. In FIGS.7 and 8, those parts which are the same as those corresponding parts in FIGS.4 through 6 are designated by the same reference numerals, and a description thereof will be omitted.

In an outer bonding tool 5A shown in FIG.7, projections 56 are arranged at predetermined intervals in the U-shaped groove 55. The height of each projection 56 is greater than the thickness of the outer lead 35B but is set so as not to hit the surface of the circuit substrate 1. If the thickness of the outer lead 35B is 20 to 40 μm, for example, the height of the projection is approximately 40 to 60 μm. In addition, the predetermined intervals of the projections 56 are set so that a slight gap is formed on both sides of the outer lead 35B as shown in FIG.8 when the outer bonding is carried out using the outer bonding tool 5A.

According to this embodiment, each outer lead 35B is positioned by two mutually adjacent projections 56 within the U-shaped groove 55. For this reason, the alignment of the outer leads 35B relative to the corresponding pads 12 is facilitated. In addition, the projections 56 prevent the melted solder paste 15 from flowing beyond the pads 12 and onto the surface of the circuit substrate 1. Hence, the short-circuiting of two mutually adjacent outer leads 35B by the melted solder paste 15 is positively prevented. Furthermore, the gap on both sides of the outer lead 35B between the two mutually adjacent projections 56 and the U-shaped groove 55 cooperate to flow the melted solder paste 15 around the sides of the outer lead 35B and onto the top surface of the outer lead 35B. Hence, the each outer lead 35B is more securely bonded onto the corresponding pad 12.

Next, a description will be given of a third embodiment of the method of producing the semiconductor device according to the present invention, by referring to FIGS.9 through 11. This embodiment of the method uses a third embodiment of the outer bonding tool according to the present invention.

Figure 9:
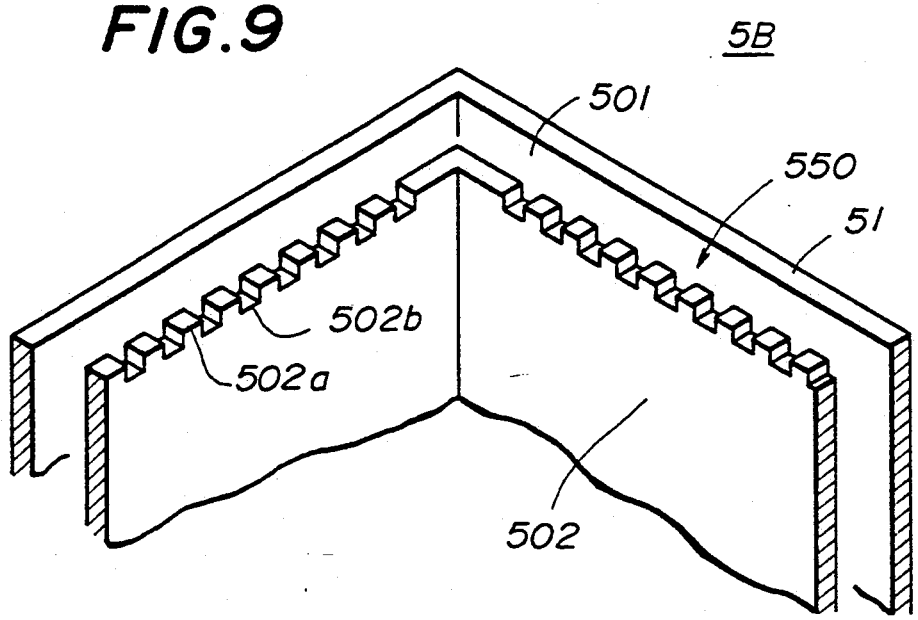
FIG.9 is a perspective view showing an essential bottom part of a third embodiment of the outer bonding tool according to the present invention.

FIG.9 shows an essential bottom part of the third embodiment of the outer bonding tool. FIG.10 is a perspective view showing an essential part of the third embodiment of the bonding tool together with the outer leads. FIG.11 is a side view in cross section showing parts at an essential stage of the third embodiment of the method. In FIGS.9 through 11, those parts which are the same as those corresponding parts in FIGS.4 through 8 are designated by the same reference numerals, and a description thereof will be omitted.

According to this embodiment, an outer bonding tool 5B is made up of an outer tool part 501 and an inner tool part 502. The pressing surface 51 is provided at the bottom of the outer tool part 501. ON the other hand, convex parts 502a and concave parts 502b are alternately formed on the bottom of the inner tool part 502. The height of the convex part 502a (or the depth of the concave part 502b) is less than or equal to the thickness of the outer lead 35B. A gap 550 which functions similarly as the U-shaped groove 55 of the second embodiment is formed between the outer and inner tool parts 501 and 502.

Figure 10:
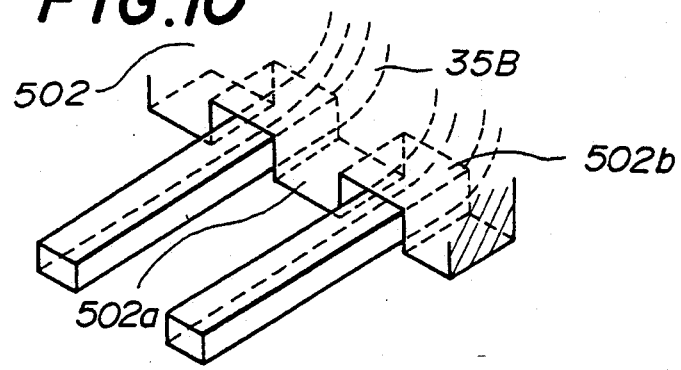
FIG.10 is a perspective view showing parts at an essential stage of a third embodiment of the method of producing the semiconductor device according to the present invention.

The convex part 502a has a width corresponding to the width of the outer lead 35B, and the outer leads 35B smoothly fit into the corresponding convex parts 502a of the inner tool part 502 as shown in FIG.10 when carrying out the bonding. Hence, it is possible to accurately align the outer leads 35B relative to the corresponding pads 12 even if the outer leads 35B do not extend from the support film 32 in a perfectly uniform arrangement. In other words, the outer leads 35B may be bent in an arbitrary direction prior to the bonding, but the inner tool part 502 ensures correct alignment of the outer leads 35B regardless of the state of the outer leads 35B.

Figure 11:
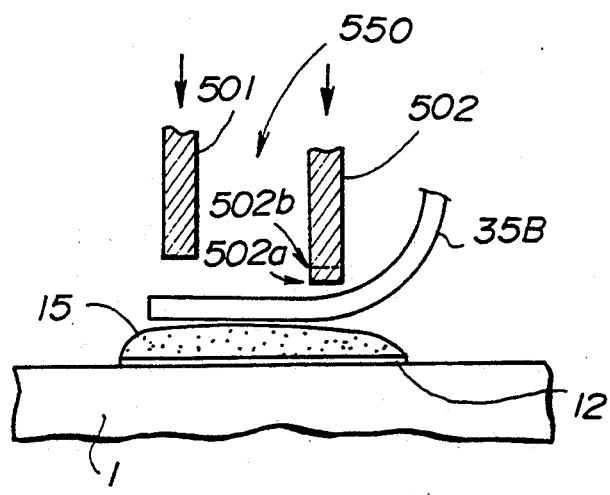
FIG.11 is a cross sectional view showing parts at an essential stage of the third embodiment of the method.

When carrying out the bonding, the inner tool part 502 is first lowered as shown in FIG.11 to align the outer leads 35B relative to the corresponding pads 12. Then, the outer tool part 501 is lowered to press against the tip parts of the outer leads 35B. In order to uniformly heat and melt the solder paste 15, it is desirable that the outer and inner tool parts 501 and 502 are independently provided with built-in heaters. A known means for lowering the outer bonding tool may be used to drive each of the outer and inner tool parts 501 and 502 independently, and a description thereof will be omitted.

In each of the above described embodiments, at least the pressing surface at the bottom of the outer bonding tool is made of a material which has a high thermal conductivity and desirably having a solder repelling characteristic. For example, the material may be selected from a group consisting of stainless steel, molybdenum, inconel, and diamond.

In addition, the four U-shaped groove in the first and second embodiments may be connected to form a single continuous U-shaped groove, although it is sufficient for the U-shaped groove to be provided for a length corresponding to each group of outer leads extending from the four sides of the semiconductor chip.

The heating time of the outer bonding tool is determined depending on various conditions such as the size of the pads and the kind of solder paste used. In order to achieve the objects of the present invention, however, it is sufficient that the pressing surface is heated to a predetermined temperature for a predetermined time at least while the pressing surface makes contact with the outer leads. In addition, in the case of the third embodiment, the inner and outer tool parts may be heated for mutually different times.

Further, the present invention is not limited to these embodiments, but various variations and modifications may be made without departing from the scope of the present invention.

What is claimed is:

1. A method of producing a semiconductor device using an outer bonding tool which is adapted for use in bonding outer leads of a tape carrier on corresponding pads which are formed on a circit substrate by solder after bonding inner leads of the tape carrier and electrodes of a generally rectangular semiconductor chip, said outer bonding tool comprising a main body having a bottom surface, a pressing surface provided at the bottom surface of said main body for pressing against the outer leads of the tape carrier, said pressing surface having a generally rectangular frame shape, and a groove formed in said pressing surface and extending generally perpendicularly to a corresponding group of outer leads which extend in a predetermined direction from one side of the semiconductor chip, a width of said groove taken in said predetermined direction being smaller than a length of the outer leads, said method comprising the steps of:

(a) aligning the outer leads on the corresponding pads which are precoated with solder so that a bottom surface of each outer lead rests on the solder precoated on the corresponding pad on the circuit substrate; and (b) moving the main body of the outer bonding tool relative to the circuit substrate so that the pressing surface presses against each top surface of the outer leads, said pressing surface being heated to a predetermined temperature for a predetermined time to melt the solder at least while the pressing surface makes contact with the outer leads, so that the melted solder flows around sides of the outer lead and reaches the top surface of the outer lead via the groove.

2. The method of producing a semiconductor device as claimed in claim 1, wherein the outer bonding tool used further comprises projections provided in the groove at predetermined intervals and said step (a) fits the outer lead between two mutually adjacent ones of the projections, and the projections have a height from a bottom of the groove greater than a thickness of the outer leads such that there is no contact between the projections and the circuit substrate when said step (b) moves the main body so that the pressing surface makes contact with the outer leads.

3. The method of producing a semiconductor device as claimed in claim 2, wherein a distance between two mutually adjacent ones of the projections is greater than a width of the outer leads.

4. The method of producing a semiconductor device as claimed in claim 3, wherein the projections substantially isolate each of the pads on the circuit substrate when said step (b) moves the main body so that the pressing surface makes contact with the outer leads.

5. A method of producing a semiconductor device using an outer bonding tool which is adapted for use in bonding outer leads of a tape carrier on corresponding pads which are formed on a circuit substrate by solder after bonding inner leads of the tape carrier and electrodes of a generally rectangular semiconductor chip, the outer leads being arranged in a plurality of groups, each group extending along a side of the chip, with the outer leads extending outwards from the chip in a predetermined direction, said outer bonding tool comprising the inner tool part having a bottom surface, a first pressing surface provided at the bottom surface of said inner tool part for pressing against the outer leads of the tape carrier, said first pressing surface having a generally rectangular frame shape, an outer tool part having a bottom surface, said outer tool part being arranged on an outer side of said inner tool part, a second pressing surface provided at the bottom surface of said outer tool part for pressing against the outer leads of the tape carrier, said second pressing surface having a generally rectangular frame shape, a gap being formed between the first and second pressing surfaces and extending generally perpendicularly to each corresponding group of outer leads extending from the sides of the semiconductor chip, a width of said gap taken in the predetermined direction in which the corresponding group of outer leads extend being smaller than a length of the outer leads, said method comprising the steps of:

(a) aligning the outer leads on the corresponding pads which are precoated with solder so that a bottom surface of each outer lead rests on the solder precoated on the corresponding pad on the circuit substrate;

(b) moving the inner tool part relative to the circuit substrate so that the first pressing surface presses against each top surface of the outer leads, said first pressing surface being heated to a predetermined temperature for a first determined time to melt the solder at least while the first pressing surface makes contact with the outer leads; and (c) moving the outer tool part relative to the circuit substrate so that the second pressing surface presses against each top surface of the outer leads, said second pressing surface being heated to a predetermined temperature for a second predetermined time to melt the solder at least while the second pressing surface makes contact with the outer leads, a gap formed between the inner and outer too parts permitting the melted solder to flow around sides of the outer lead and reach the top surface of the outer lead.

6. The method of producing a semiconductor device as claimed in claim 5, wherein a plurality of convex parts and concave parts are formed on the first pressing surface of the inner tool part at predetermined intervals so that said step (a) can fit the outer lead between two mutually adjacent ones of the convex parts, and the convex parts have a height from the concave parts less than or equal to a thickness of the outer leads such that there is no contact between the convex parts and the circuit substrate when said step (b) moves the inner tool part so that the first pressing surface makes contact with the outer leads.

7. A method of producing a semiconductor device using an outer bonding tool which is adapted for use in bonding outer leads of a tape carrier on corresponding pads which are formed on a circuit substrate by solder after bonding inner leads of the tape carrier and electrodes of a generally rectangular semiconductor chip, the outer leads being arranged in a plurality of groups, each group extending along a side of the chip, with the outer leads extending outwards from the chip in a predetermined direction, said method comprising the steps of:

(a) aligning the outer leads on the corresponding pads which are precoated with solder so that a bottom surface of each outer lead rests on the solder precoated on the corresponding pad on the circuit substrate; and (b) pressing and heating the outer leads by the outer bonding tool which makes contact with top surfaces of the outer leads so that melted solder flows around sides of the outer lead and reaches the top surface of the outer lead, the melted solder being guided to the top surface of the outer lead via a guide passage provided in the outer bonding tool, the guide passage extending generally perpendicular to the outer leads.

8. The method of producing a semiconductor device as claimed in claim 7, wherein said step (a) aligns the outer leads relative to the corresponding pads using a part of the outer bonding tool.

9. An outer bonding tool adapted for use in bonding outer leads of a tape carrier on corresponding pads which are formed on a circuit substrate by solder after bonding inner leads of the tape carrier and electrodes of a generally rectangular semiconductor chip, and outer bonding tool comprising:

a main body having a bottom surface;

a pressing surface provided at the bottom surface of said main body for pressing against the outer leads of the tape carrier, said pressing surface having a generally rectangular frame shape; and a groove formed in said pressing surface and extending generally perpendicularly to a corresponding group of outer leads which extend outwards in a predetermined direction from one side of the semiconductor chip, a width of said groove taken in said predetermined direction being smaller than a length of the outer leads.

10. The outer bonding tool as claimed in claim 9, wherein said groove is provided with respect to each group of outer leads extending from four sides of the semiconductor chip.

11. The outer bonding tool as claimed in claim 9, wherein said groove has a generally U-shape.

12. The outer bonding tool as claimed in claim 9, wherein a depression is formed at a central part of the bottom surface of said main body, said depression has walls defining an inner contour of the frame shape of the pressing surface, and said depression has a depth greater than a height of the semiconductor chip.

13. The outer bonding tool as claimed in claim 9, wherein at least said pressing surface is made of a material selected from a group consisting of stainless steel, molybdenum, inconel, and diamond.

14. An outer bonding tool adapted for use in bonding outer leads of a tape carrier on corresponding pads which are formed on a circuit substrate by solder after bonding inner leads of the tape carrier and electrodes of a generally rectangular semiconductor chip, the outer leads being arranged in a plurality of groups, each group extending along a side of the chip, with the outer leads extending outwards from the chip in a predetermined direction, said outer bonding tool comprising:

an inner tool part having a bottom surface;

a first pressing surface provided at the bottom surface of said inner tool part for pressing against the outer leads of the tape carrier, said first pressing surface having a generally rectangular frame shape;

an outer tool part having a bottom surface, said outer tool part being arranged on an outer side of said inner tool part;

a second pressing surface provided at the bottom surface of said outer tool part for pressing against the outer leads of the tape carrier, said second pressing surface having a generally rectangular frame shape, a gap being formed between the first and second pressing surfaces and extending generally perpendicularly to each corresponding group of outer leads extending from the sides of the semiconductor chip, a width of said gap taken in the predetermined direction in which the corresponding group of outer leads extends being smaller than a length of the outer leads.

15. The outer bonding tool as claimed in claim 14, which further comprises a plurality of convex parts and concave parts formed on the first pressing surface at predetermined intervals so that the outer lead can fit between two mutually adjacent ones of said convex parts, said convex parts having a height from said concave parts less than or equal to a thickness of the outer leads such that there is no contact between said convex parts and the circuit substrate when said first pressing surface makes contact with the outer leads.

16. The outer bonding tool as claimed in claim 15, wherein a distance between two mutually adjacent ones of said convex parts is greater than a width of the outer leads.

17. The outer bonding tool as claimed in claim 14, wherein at least said first and second pressing surfaces are made of a material selected from a group consisting of stainless steel, molybdenum, inconel, and diamond.

18. The outer bonding tool as claimed in claim 14, wherein said inner and outer tool parts are independently driven.

19. An outer bonding tool adapted for use in bonding outer leads of a tape carrier on corresponding pads which are formed on a circuit substrate by solder after bonding inner leads of the tape carrier and electrodes of a generally rectangular semiconductor chip, said outer bonding tool comprising:
a main body having a bottom surface;
a pressing surface provided at the bottom surface of said main body for pressing against the outer leads of the tape carrier, said pressing surface having a generally rectangular frame shape;
a groove formed in said pressing surface and extending generally perpendicularly to a corresponding group of outer leads which extend outwards in a predetermined direction from one side of the semiconductor chip, a width of said groove taken in said predetermined direction being smaller than a length of the outer leads, and
projections provided in said groove at predetermined intervals so that the outer lead can fit between two mutually adjacent ones of said projections, said projections having a height from a bottom of said groove greater than a thickness of the outer leads such that there is no contact between said projections and the circuit substrate when said pressing surface makes contact with the outer leads.

20. The outer bonding tool as claimed in claim 19, wherein a distance between two mutually adjacent ones of said projections is greater than a width of the outer leads.

21. The outer bonding tool as claimed in claim 19, wherein said projections substantially isolate each of the pads on the circuit substrate when said pressing surface makes contact with the outer leads.

* * * * *